(12) United States Patent
Liu et al.

(10) Patent No.: US 8,266,556 B2
(45) Date of Patent: Sep. 11, 2012

(54) FRACTURING CONTINUOUS PHOTOLITHOGRAPHY MASKS

(75) Inventors: Ying Liu, Austin, TX (US); David Osmond Melville, Watson, NY (US); Alan E Rosenbluth, Watson, NY (US); Kehan Tian, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 12/849,171

(22) Filed: Aug. 3, 2010

(65) Prior Publication Data

US 2012/0036487 A1    Feb. 9, 2012

(51) Int. Cl.
*G06F 17/50* (2006.01)

(52) U.S. Cl. ............... 716/53; 716/50; 716/52; 716/54; 716/55; 716/56; 430/5; 430/30

(58) Field of Classification Search .............. 716/50–56; 430/5, 30
See application file for complete search history.

(56) References Cited

U.S. PATENT DOCUMENTS

| | | | | |
|---|---|---|---|---|
| 5,879,844 A * | 3/1999 | Yamamoto et al. | ............. | 430/30 |
| 5,991,006 A * | 11/1999 | Tsudaka | ............. | 355/53 |
| 6,128,067 A * | 10/2000 | Hashimoto | ............. | 355/52 |
| 6,481,004 B2 | 11/2002 | Inanami et al. | | |
| 6,560,768 B2 | 5/2003 | Inanami et al. | | |
| 6,934,410 B1 | 8/2005 | Aleshin et al. | | |
| 7,073,162 B2 * | 7/2006 | Cobb et al. | ............. | 716/52 |
| 7,080,349 B1 * | 7/2006 | Babcock et al. | ............. | 716/53 |
| 7,237,221 B2 * | 6/2007 | Granik et al. | ............. | 716/52 |
| 7,332,252 B2 * | 2/2008 | Kang et al. | ............. | 430/5 |
| 7,562,336 B2 | 7/2009 | Torres Robles et al. | | |
| 7,579,606 B2 | 8/2009 | Yoshida et al. | | |
| 7,861,207 B2 * | 12/2010 | Word et al. | ............. | 716/55 |
| 2005/0147893 A1 * | 7/2005 | Ogawa et al. | ............. | 430/5 |
| 2005/0278686 A1 * | 12/2005 | Word et al. | ............. | 716/21 |
| 2007/0277145 A1 * | 11/2007 | Scaman | ............. | 716/19 |
| 2009/0070732 A1 | 3/2009 | Sahouria et al. | | |
| 2009/0235209 A1 | 9/2009 | Sawicki et al. | | |
| 2011/0278731 A1 * | 11/2011 | Fujimura et al. | ............. | 257/774 |

OTHER PUBLICATIONS

E-Beam Initiative, DFEB Methodology Guidelines for Physical Design Engineers, 1-47, Revision 2.1Nov. 9, 2009.
Schulze et al; High-performance fracturing for variable shaped beam mask writing machines, 648-659, SPIE, 5130, 2003.
Yehia, Mask-friendly OPC for a reduced mask cost and writing time, 6520, 2007.

(Continued)

*Primary Examiner* — Thuan Do
*Assistant Examiner* — Nha Nguyen
(74) *Attorney, Agent, or Firm* — Garg Law Firm, PLLC; Rakesh Garg; Libby Z. Toub (57) ABSTRACT

A method, system, and computer usable program product for fracturing a continuous mask usable in photolithography are provided in the illustrative embodiments. A first origin point is selected from a set of points on an edge in the continuous mask. A first end point is identified on the edge such that a separation metric between the first origin point and the first end point is at least equal to a threshold value. Several alternatives are determined for fracturing using the first origin point and the first end point. A cost associated with each of the several alternatives is computed and one of the alternatives is selected as a preferred fracturing. Several pairs of origin points and end points are formed from the set of points. Each pair has a cost of a preferred fracturing between the pair. The continuous mask is fractured using a subset of the several pairs.

19 Claims, 9 Drawing Sheets

OTHER PUBLICATIONS

Yoshihiro et al; An extraction of repeating patterns from OPCed layout data, 7028, 2008.

Narukawa et al; Estimation of shot counts in VSB writer using GDSII design data , 6607, 1-9, 2007.

* cited by examiner

FRACTURING CONTINUOUS PHOTOLITHOGRAPHY MASKS

BACKGROUND OF THE INVENTION

1. Field of the Invention

The present invention relates generally to an improved integrated circuit design system, and in particular, to a method for modifying an integrated circuit design for manufacture. Still more particularly, the present invention relates to a method, system, and computer usable program code for fracturing a high resolution or continuous mask for improved manufacturability using photolithography.

2. Description of the Related Art

Modern day electronics include components that use integrated circuits (ICs). Integrated circuits are electronic circuits formed using semiconductor substrates and by adding impurities to form solid-state electronic devices, such as transistors, diodes, and resistors. Commonly known as a "chip", an integrated circuit is generally encased in hard plastic. The components in modern day electronics generally appear to be rectangular black plastic pellets with connector pins protruding from the plastic encasement.

Circuit designers use a variety of software tools to design and test electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A layout includes shapes that the designer selects and positions to achieve a design objective. Through a process known as optical proximity correction (OPC), the shapes are transformed in a mask to correct for optical and other manufacturing related idiosyncrasies. This is generally done by counterbiasing the mask at each of a number of segments along the edges of the mask shapes. These segments are also known as fragments. A mask may make use of shapes that include continuous curves. An optical proximity corrected (OPC'd) mask rarely includes continuous curves.

Inverse lithography, also known as Inverse Lithography Technology (ILT), is a technique where a shape is adjusted on a mask or a portion or region of a mask using methods of numerical optimization as opposed to manipulating a shape by simple counter-biasing to correct the bias introduced by idiosyncrasies of the manufacturing process. Inverse lithography masks often include continuous curves and shapes. A continuous curve is a smooth form curve including no sharp angle or intersection of lines or curves. A continuous shape is a shape comprising a continuous curve, including a closed continuous curve.

Source Mask Optimization (SMO) is a technique where mask shapes on a mask or portion of a mask are adjusted along with the light illuminating the mask using methods of numerical optimization. SMO masks may include continuous curves and shapes.

Techniques such as OPC, ILT, and SMO usually require the calculation of intensities produced on the semiconductor wafer when the mask is illuminated. Techniques for calculating these intensities are well-known, for example by means of convolution of the mask with so-called SOCS kernels.

A high resolution mask includes shapes at such a scale that the boundary of a shape appears as a continuous curve at manufacturing resolution. In other words, even if a shape includes rectangular patterns, the size and proximity of those rectangular patterns make the shape appear as a continuous shape on a manufacturing mask. Manufacturing resolution can be considered either a resolution in terms of distance between points that can be printed on a wafer using a photolithography mask, or it may be considered a resolution in terms of distance between patterns that can be fabricated on a mask with available mask making processes. High resolution is a resolution higher than manufacturing resolution. A manufacturing mask is a mask usable for successfully manufacturing or printing the contents of the mask onto wafer.

SUMMARY OF THE INVENTION

The illustrative embodiments provide a method, system, and computer usable program product for fracturing a continuous photolithography mask. An embodiment selects from a set of points a first origin point on an edge in the continuous mask. The continuous mask is a mask usable in manufacturing an integrated circuit (IC) by photolithography. The embodiment identifies from the set of points a first end point on the edge such that a separation metric between the first origin point and the first end point is at least equal to a threshold value. The embodiment determines several alternatives for fracturing using the first origin point and the first end point. The embodiment computes a cost associated with each of the several alternatives. The embodiment selects one of the alternatives having an associated cost as a preferred fracturing between the first origin point and the first end point. The embodiment forms several pairs of origin points and end points from the set of points. Each pair has a cost of a preferred fracturing between the pair. The first original point and the first end point form a first pair in the several pairs of origin points and end points. The embodiment fractures the continuous mask using a subset of the several pairs. The fracturing produces a fractured mask to manufacture the IC.

BRIEF DESCRIPTION OF THE DRAWINGS

The novel features believed characteristic of the invention are set forth in the appended claims. The invention itself; however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A mask may include a continuous curve or a continuous shape. A mask may also include a high resolution shape that may appear as a continuous shape or a continuous curve portion thereof at manufacturing resolution. For the purposes of this disclosure, a continuous shape includes a high resolution shape, a continuous curve includes a portion of a high resolution shape that appears continuous at manufacturing resolution, and a continuous mask is a mask that includes a continuous curve or a high-resolution shape.

The invention recognizes that given the ever-reducing size of IC components and the increasing number of components per unit area, continuous masks are becoming increasingly problematic for manufacturing. In order to manufacture shapes on a wafer using a mask, a continuous shape on the mask has to be decomposable into simple shapes. For example, with some mask making processes it is desirable that the mask be projected onto a Manhattan grid. A Manhattan grid is a grid of rectangular shapes. The rectangular shapes in a Manhattan grid may be of different sizes.

As described with respect to certain embodiments of the invention, the invention recognizes that in some cases, the mask making process may prefer that the mask be decomposable into simple shapes that are rectangular, but with edges that do not lie along a common set of gridlines. As described with respect to certain embodiments of the invention, the invention recognizes that in other mask making processes the preferred simple shapes may include edges that are oriented at other than right angles, such as at 45 degrees or 135 degrees.

A shape in a continuous mask has to be capable of approximate decomposition using the preferred set of simple shapes, such as a Manhattan grid. For example, for manufacturability of a continuous mask, a continuous curve in the mask should be capable of rendering as a series of rectangular steps. A process of rendering a continuous curve on a Manhattan grid, or into simple shapes, is called fracturing. Generally, there is a limit to the number of simple shapes that a fractured mask can contain, because each shape requires a certain time to fabricate, and the chemical and mechanical stability of the mask fabrication process limits the total amount of time that can be used to fabricate a mask. Long fabrication times also tend to increase the costs of masks.

The invention recognizes that fracturing of a continuous mask should achieve a grid that satisfies the objective of the continuous mask while producing a set of simple shapes such as a Manhattan grid of manufacturing resolution or a lower resolution. A Manhattan grid produced for a continuous mask using presently available techniques often produces unsatisfactory fractured masks. The invention recognizes that certain continuous masks are either not usable at all in manufacturing given the resolution they require, or cause manufacturing defects on the wafers manufactured using a Manhattan grid produced from the present fracturing techniques, or require too many simple shapes for the full mask to be fabricable.

The invention further recognizes that the poor manufacturability of continuous masks is expensive. For example, using certain continuous masks or corresponding Manhattan grid generated from present methods in manufacturing may cause faulty circuits to be printed on the wafer, rendering expensive wafers useless.

The illustrative embodiments used to describe the invention address and solve these and other problems related to printing shapes of a layout in photolithography. The illustrative embodiments provide a method, computer usable program product, and an apparatus for fracturing a continuous mask for improved manufacturability in photolithography.

The examples in this disclosure are used only for the clarity of the description and are not limiting on the illustrative embodiments. Additional operations, actions, tasks, activities, and manipulations will be conceivable from this disclosure and the same are contemplated within the scope of the illustrative embodiments.

The illustrative embodiments are described using specific code, data structures, designs, layouts, schematics, and tools only as examples and are not limiting on the illustrative embodiments. The illustrative embodiments may be implemented with respect to other similarly purposed code, data structures, designs, layouts, schematics, and tools within the scope of the invention.

Furthermore, the illustrative embodiments may be described in some instances using particular systems, applications, or architectures only as an example for the clarity of the description. The illustrative embodiments may be used in conjunction with other comparable or similarly purposed systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 1:
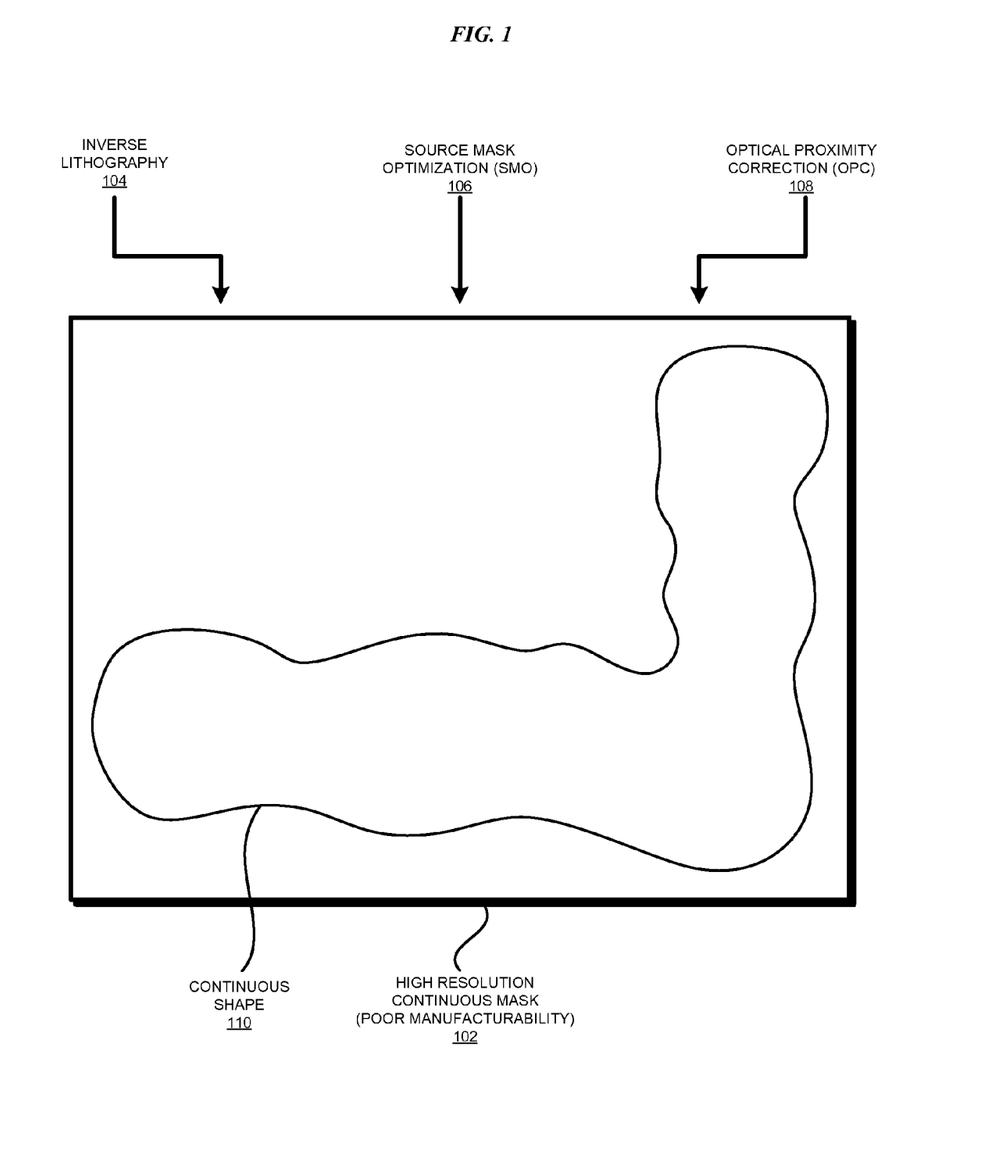
FIG. 1 depicts a block diagram of high resolution or continuous mask in which the illustrative embodiments may be implemented.

With reference to FIG. 1, this figure depicts a block diagram of a high resolution or continuous mask in which the illustrative embodiments may be implemented. Mask 102 may be a continuous mask or a high resolution mask. Mask 102 may be generated from inverse lithography process 104, source mask optimization (SMO) process 106, or OPC process 108.

Normally, a mask may include many shapes in various configurations. As a simplified example for the clarity of the description, and to not obscure the illustration with unnecessary details, shape 110 is depicted as the only shape in mask 102.

When mask 102 is a continuous mask, shape 110 is a continuous shape. Only as an example, continuous shape 110 is depicted as a closed continuous curve formed using a series of arcs. Shape 110 may include continuous and non-continuous curves, and may be an open or closed shape.

When mask 102 is a high resolution mask, shape 110 may be a shape formed using a series of rectangular steps when viewed at the designated resolution of the mask. Under manufacturing resolution, shape 110 appears as a continuous shape in the manner depicted in FIG. 1. Each rectangle, including the rectangular steps converted into complete rectangles and rectangles of various dimensions occupying the space within shape 110, is called a shot. An embodiment may allow the shots in a modified mask-making process to include shapes which have edges oriented at other than right angles, for example at 45 degrees or 135 degrees, such as in right-triangular shapes.

Figure 2:
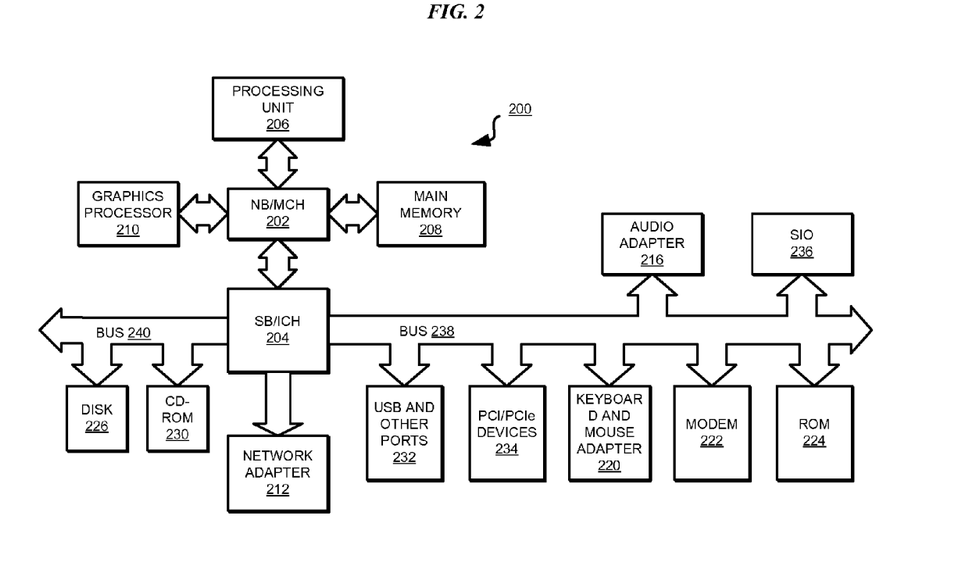
FIG. 2 depicts a block diagram of a data processing system in which illustrative embodiments may be implemented.

With reference to FIG. 2, this figure depicts a block diagram of a data processing system in which illustrative embodiments may be implemented. Data processing system 200 is an example of a computer in which computer usable program code or instructions implementing the processes may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft° Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java is a trademark of Sun Microsystems, Inc., in the United States and other countries).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware and software in FIG. 2 may vary depending on the implementation. Other internal hardware or peripheral devices, such as flash memory, equivalent non-volatile memory, or optical disk drives and the like, or other comparable software or firmware may be used in addition to or in place of the hardware depicted in FIG. 2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIG. 2 and above-described examples are not meant to imply architectural limitations. For example, data processing system 200 also may be a tablet computer, laptop computer, or telephone device in addition to taking the form of a PDA.

Figure 3:
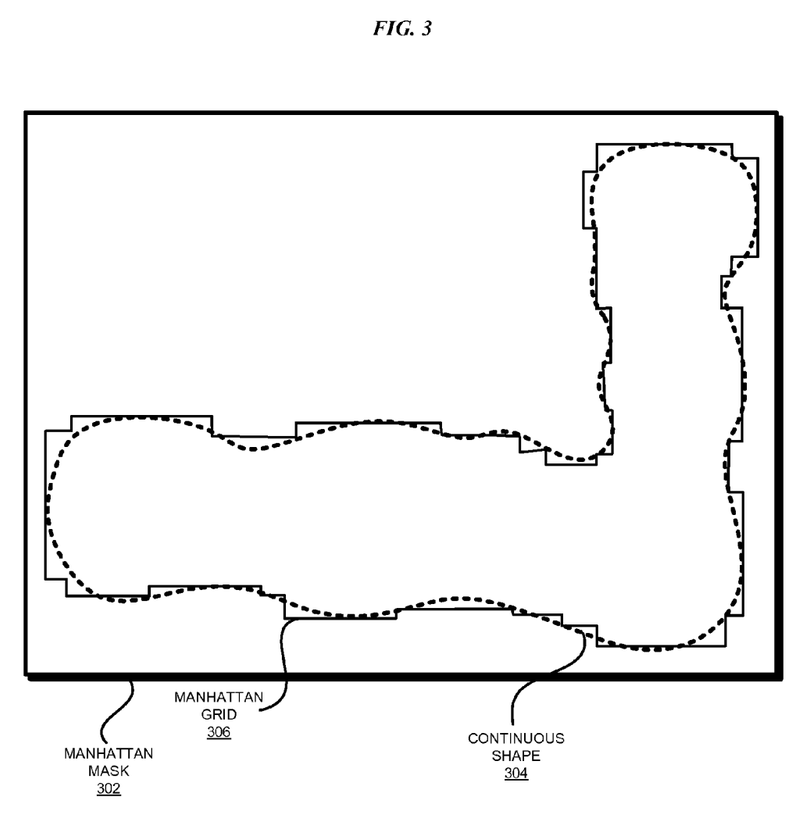
FIG. 3 depicts a block diagram of fracturing a continuous mask into a Manhattan mask in accordance with an illustrative embodiment.

With reference to FIG. 3, this figure depicts a block diagram of fracturing a continuous mask into a Manhattan mask in accordance with an illustrative embodiment. Manhattan mask 302 is a fractured representation of a continuous mask, such as mask 102 in FIG. 1. Continuous shape 304 may be similar to shape 110 in FIG. 1.

Upon fracturing according to an illustrative embodiment, continuous shape 304 results in Manhattan grid 306. For manufacturing purposes, Manhattan grid 306 includes shots of size suitable for manufacturing resolution or larger. When continuous shape 304 is a high resolution shape, Manhattan grid 306 re-fractures shape 304 resulting in shots of size larger than the size of shots in the high resolution shape 304.

Figure 4:
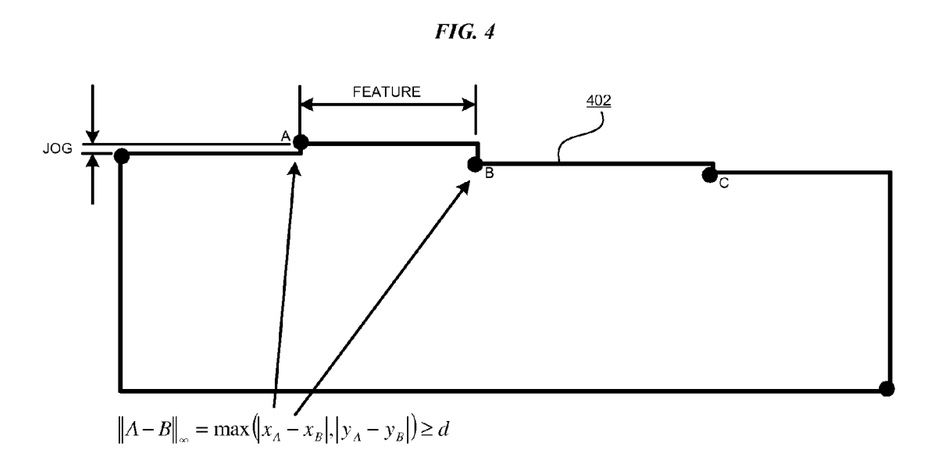
FIG. 4 depicts a block diagram of a process for determining a fracturing point in a Manhattan grid in accordance with an illustrative embodiment.

With reference to FIG. 4, this figure depicts a block diagram of a process for determining a fracturing point in a Manhattan grid in accordance with an illustrative embodiment. Shape 402 may be a set of shots forming all or a portion of a fractured shape. A set of shots is one or more shots.

Points labeled "A", "B", and "C", are some example points where jogs appear in shape 402. A jog is a displacement or offset in one dimension, typically the X-axis or Y-axis, of a shot from the immediately adjacent shot. One or more shots between two adjacent points, such as between points A and B, form a feature of shape 402.

Determining where to jog and what the size of the feature would be is a non-trivial aspect of generating a Manhattan grid. Computing the jog and the size of the feature can directly affect the manufacturability of the Manhattan grid, the Manhattan grid achieving the desired design characteristic post-fracturing, and the number of shots in a given shape.

In accordance with an embodiment, the position of point B with respect to point A, thereby setting the jog between those points and the size of the feature bound by those points, can be computed using a threshold value "d". According to the embodiment, point B should be chosen relative to point A such that the infinity norm of the two adjacent points ($\|A-B\|_\infty$) is greater than or equal to "d".

$$\|A-B\|_\infty = \max(|x_a-x_b|, |y_a-y_b|) \geq d$$

$(x_a, y_a)$ and $(x_b, y_b)$ represent the coordinates of points A and B on a two-axis plane.

In such an embodiment, the jog and the size of the feature between points A and B is so adjusted that at least one value of the jog and feature exceeds the threshold distance d. One effect of this method of placing fracturing points on shape 402 is that any smaller shots between points A and B, such as in a high resolution shape, can be absorbed in the grid feature created between points A and B according to the embodiment.

Figure 5:
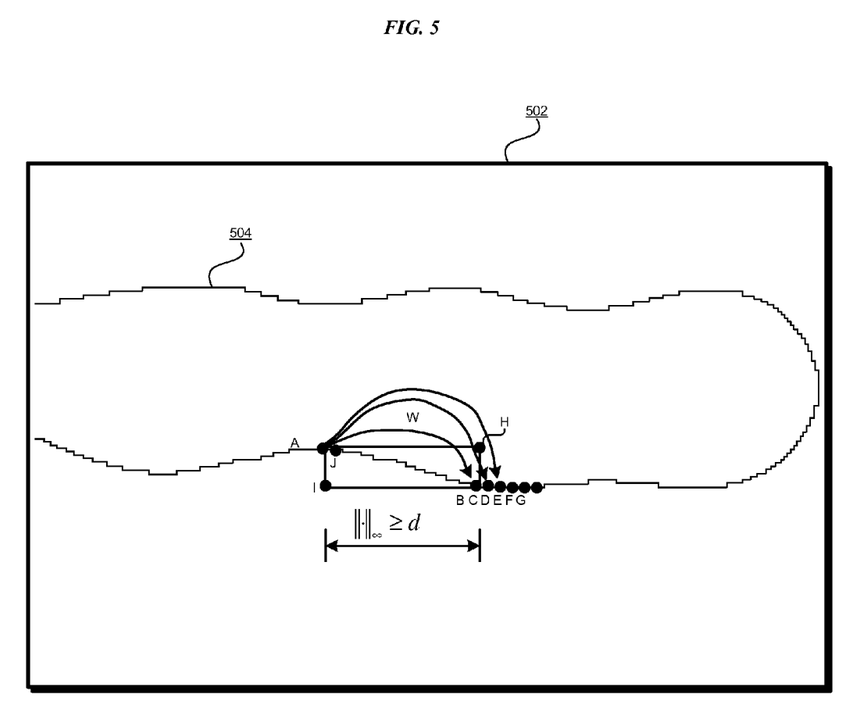
FIG. 5 depicts a diagram of a process of fracturing a continuous mask into a Manhattan grid in accordance with an illustrative embodiment.

With reference to FIG. 5, this figure depicts a diagram of a process of fracturing a continuous mask into a Manhattan grid in accordance with an illustrative embodiment. Only as an example to illustrate an operation of an embodiment, mask 502 is depicted to include shape 504, which is an enlarged portion of a high resolution shape.

According to an embodiment, the process of FIG. 4 is performed as follows: starting at point "A"—an origin point, an algorithm traverses shape 504 to point "B"—an end point—such that the infinity norm between points A and B is greater than or equal to a threshold value "d". A rectangle is constructed having its corners at points A, H, B, and I (rectangle AHBI).

Points H and I may or may not lie on shape 504. The algorithm computes an area of the rectangle that lies above (or, on one side of) the curve of shape 504 between points A and B. An area of the rectangle that lies below (or, on the opposite side of) the curve of shape 504 between points A and B is similarly computed.

The first of these two areas constitutes a cost of fracturing along step AHB of rectangle AHBI. The second of these two areas constitutes a cost of fracturing along step AIB of rectangle AHBI. In other words, the first area is a cost of replacing the curve of shape 504 between points A and B with step AHB and the second area is a cost of replacing the curve of shape 504 between points A and B with step AIB in a corresponding Manhattan grid. The algorithm retains the smaller of the two costs and discards the larger of the two costs.

Corners AHB and AIB are shown in FIG. 5 as sharp. It is known in the art that corners cannot actually be rendered on masks as perfectly sharp. A convenient way to partially take this effect into account is to compute the cost of paths AHB and AIB by treating their interior corners as rounded arcs, with radius of curvature equal to the resolution of the mask making process.

The algorithm now moves the end point from point "B" to point "C". The algorithm repeats the computations described above using points A and C instead of points A and B. Again, two costs are computed for fracturing the curve between points A and C, and the smaller of the two costs is retained and the larger cost discarded.

Additionally, before selecting the smaller of the two costs between points A and C, the algorithm also determines whether the difference between the two costs exceeds a cost threshold value. If the difference does not exceed the cost threshold, the smaller cost between points A and C is selected.

The algorithm successively moves to end points D, E, F, G, and so on, until the cost difference between the two costs of fracturing the curve between the origin point A and the latest end point, for example, point G, exceeds the cost threshold. The algorithm retreats to the immediately previous point, for example, point F, and stores the cost of fracturing the curve between points A and F according to a smaller cost step of the rectangle between points A and F. The algorithm then shifts the origin point from point A to point J and repeats the computations, such as between points J and B, J and C, and so on.

The entire curve of shape 504 is traversed by the algorithm in this manner. The traversal creates many possible approximations of the shape 504 on the Manhattan grid. When the entire curve of shape 504 is traversed, such as by returning to the first origin point A, a set of costs is available to the algorithm by selecting one traversal paths in which the infinity norm between any two points are larger than the threshold d. A set of costs is one or more costs.

Using the set of costs, a set of approximations of shape 504 can be created in a Manhattan grid. The total of all costs in a given approximation is the cost of that approximation. The algorithm selects the approximation that incurs the globally least total cost, thereby forming the best overall Manhattan grid approximation for shape 504. A method, such as dynamic programming, can be used to calculate a suitable approximation, which is globally optimal for each shape.

In one embodiment, the Manhattan grid approximation that incurs the least total cost is established in an interleaved fashion with the calculation of the lowest cost alternative paths between pairs of points. For example, before calculating the lowest cost fracturing for pairs of points which begin with point D, where such pairs might for example include pairs (D,E), (D,F), or (D,G), one can first determine the lowest cost total fracturing between origin A and point D. As will be seen, the lowest cost total fracturing path from the origin point A to any point lying between A and D, such as to B or to C, will already have been determined in interleaved fashion prior to calculation of the lowest cost fracturings involving point pairs that begin with B or C points.

Furthermore, the lowest cost alternative fracturing path across every individual point pair that terminates at D will already be known, since the starting point in any such pair will already have been processed by the time D is reached. This means that one will also know the lowest total cost among all possible fracturings between A and D that include any other specified point between A and D as the preceding point to D. For example, the lowest cost of fracturing the mask between A and D with final fracturing occurring along a path between C and D will be equal to the lowest cost of fracturing between A and C, plus the lowest cost fracture path alternative between C and D. Thus, the lowest cost fracture from A to D with C as the preceding point to D becomes known.

Next, by comparing the lowest fracturing costs of paths having every possible immediately preceding point to D, such as C and B, the lowest overall fracturing cost between A and D can be established. Once this interleaved step is done, the cost of fracturing between pairs of points that begin with D and terminate with later points commences, in accordance with the procedure described earlier. Then, according to the interleaved procedure of an embodiment, the lowest cost fracturing between points A and E is next determined, and so forth, until upon completion the lowest cost fracturing of polygon 504 is known.

The above-described embodiment uses a practical problem formulation, and a solution method that achieves a globally optimum solution under the formulation used. However, other formulations of the lowest cost fracturing problem formulation may be employed in conjunction with certain aspects of an embodiment within the scope of the invention. For example, one may obtain the solution using what is referred to in the art as a Linear Programming (LP) code. As another example, one may set a requirement on the maximum total number of edge fragments allowed in the fracture of a polygon, and the associated optimum fracturing may be obtained by using what is referred to in the art as a Mixed-Integer Linear Programming (MILP) code. For example, a variable $b_{s,t}$ may be given a value 1 when an allowed fracture path is used to immediately connect points s and t in the solution; $b_{s,t}$ is given a value of 0 otherwise. The fracture cost of this path segment may be denoted $P_{s,t}$. $b_{s,t}$ may be, for example, a variable in a MILP problem. A MILP code can then find the best fracturing of the polygon by minimizing the sum of the quantities $P_{s,t} * b_{s,t}$, with the sum extending over all variables, and subject to a constraint that the sum of the quantities $E_{s,t}*b_{s,t}$ be no larger than the maximum allowed number of polygon edges, with $E_{s,t}$ denoting the number of edges in a particular fracture path that immediately connects s and t. Additional constraints may be imposed to ensure a valid path, for example constraints which require that, for each point u, the sum over all v of $b_{u,v}$ be equal to the sum over all v of $b_{v,u}$, with the sole exceptions that at the start point the first sum must be larger by 1, and that at the end point the second sum must be larger by 1. It will be appreciated by those skilled in the art that many such variants in formulation and solution method are possible, and that their choice involves tradeoffs in optimization speed.

An embodiment may allow using any suitable metric to determine the cost associated with a potential fracturing between two points such as A and B. For example, in one embodiment of the invention, the cost of a potential fracturing path n between A and B, denoted $P_{AB}(n)$, may be taken as the interference perturbation metric given by $$P_{AB}(n) = |\Phi_0 * m||\Phi_0 * (m-n)|$$

Here, * denotes convolution, and $\Phi_0$ may denote the dominant SOCS kernel. A kernel is the mathematical base function to describe the property of an optical lithography system. An optical lithography system can be described by a set of kernels for mathematical description as well as numerical computation. In the set of mathematical base functions of optical lithography system (kernels), the one with most significant contribution is called the "dominant kernel". When the optical lithography system is described by Sum-of-Coherent-System (SOCS) method, the kernels are called SOCS kernels.

In many cases the term "$\Phi_0 * m$" will already be calculated prior to fracturing, e.g. when polygon 504 is determined using OPC, ILT, or SMO. The term $\Phi_0 * (m-n)$ only involves the small area over which masks m and n differ between points A and B, making this calculation very efficient. In one embodiment the convolutions in this expression for $P_{AB}(n)$ are evaluated at a particular point, which may be chosen, for example, as a point along contour 504 between points A and B.

In some embodiments, other functions may be chosen for $\Phi_0$ besides the dominant SOCS kernel. For example, by choosing $\Phi_0$ to be everywhere equal to unity, $P_{AB}(n)$ is made equivalent to an area-matching metric.

In some embodiments the convolutions in $P_{AB}(n)$ are evaluated at more than one point, for example at more than one point in the neighborhood of A and B, with the point at which the cost metric is largest then being used to determine $P_{AB}(n)$.

When mask shapes such as 504 are designed using SMO or ILT, the quality of the image produced by the shapes may be set using constraints $C_r(v) < 0$ that are applied at different evaluation points in the image, also known as sample points. Here v denotes the optimization variables used by ILT or SMO. Index r distinguished different constraints. By convention we may designate the objective function to be maximized by ILT or SMO as $C_0(v)$. In one embodiment of the invention, the points at which the convolutions in $P_{AB}(n)$ are evaluated are chosen to be the image sample points that lie in the immediate neighborhood of points A and B, such as within a distance from A or B equal to the resolution of the lithographic lens.

A number of expressions may be chosen for the fracturing cost $P_{AB}(n)$ that involve SMO or ILT constraints, trading off sophistication of the metric for processing speed. For example, one may choose:

$$P_{AB}(n) = \text{Max}(P_{AB,0}, P_{AB,1}, P_{AB,2}, P_{AB,3}, \ldots)$$

In this expression $P_{AB,r}$ denotes a particular quantity that is evaluated for the rth constraint from among those constraints that involve intensities in the neighborhood of points A and B. More specifically, $P_{AB,r}$ may be chosen as $$P_{AB,r} = (dC_r/dI) \cdot \text{Sum}[(\Phi_k * m)(\Phi_0 * (m-n))]$$

Here $dC_r/dI$ denotes the gradient of constraint r with respect to all sampled intensities in the neighborhood of points A and B. The Sum in this expression is also evaluated at each of these sampled intensity points, and is further carried out over a sufficient number of SOCS kernels k, when calculating intensities. Since the rth constraint takes the form $C_r(v) < 0$, it is possible in unusual circumstances for $P_{AB,1}$, $P_{AB,2}$, $P_{AB,3}$, ... to all be negative and therefore not impacting the solution unfavorably. To maintain some positive penalty for fracturing error one may then choose to prepend a special term $P_{AB,0}$ to the $P_{AB,r}$ list, as is shown above; for example one may choose $$P_{AB,0} = \epsilon(|\Phi_0 * m||\Phi_0 * (m-n)|)$$

with the quantity on the right being, for example, averaged over all sample points in the neighborhood of points A and B, and with $\epsilon$ chosen as a small positive weight, such as 0.01.

Specific algorithms, problem formulation methods, or computational techniques are described in this disclosure only as examples and are not intended to be limiting on the invention. These and other similar algorithms, methods, or techniques may be used for implementing an embodiment without departing the scope of the invention. Such algorithms, methods, and techniques may be usable for tuning or specializing an embodiment of the invention for solving specific implementation problems. An embodiment tuned or specialized in this manner is contemplated within the scope of the invention.

In one embodiment of the invention, potential updates to the high resolution mask m are cached as part of the interleaved calculation in which lowest cost fracturings between successive points are determined. The convolutions involved in calculating the costs P between such pairs of points may also be cached, e.g. the cost $P_{AB}(n)$ between points A and B for some lowest cost fracturing n between points A and B. Once the lowest cost fracture is established for a polygon such as 504, the mask m and associated convolutions may be updated from these cached results.

In one embodiment, points A and B may be separated by more than some first specified distance (the minimum separation) in order that the new fracture paths achieve the desired degree of coarseness, thereby providing a desirable reduction in shot count. If large values of the cost $P_{AB}(n)$ are consistently found along the new path alternatives, an embodiment may reduce this minimum separation.

Furthermore, the same set of values for minimum separation and other parameters need not be used in all parts of the mask. In some embodiments, different parameter values are used for different polygons in the mask, or for different parts of individual polygons. For example, in SMO applications one may design the polygons to maximize the range of fluctuations in lithographic dose, focus, and mask bias over which all features print within tolerance. In this case, only those portions of features in the solution whose sensitivity is close to the tolerance limit will be critical to the process window. In such regions, an embodiment may employ a smaller minimum separation between points like A and B that lie along a potential fracture path.

The invention need not be limited to consideration of alternative fracture paths between points such as A and B that are precisely two in number, such as the two paths AHB and AIB in FIG. 5. Specifically, when points A and B exceed a second separation distance which may be larger than the first separation distance, an embodiment of the invention may consider additional new path options, such as via a third point.

Figure 6A:
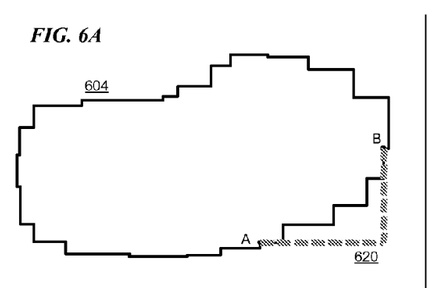
FIGS. 6A-6F depict several diagrams of example alternative fracture paths between two points via one or more additional points in accordance with an illustrative embodiment.
Figure 6B:
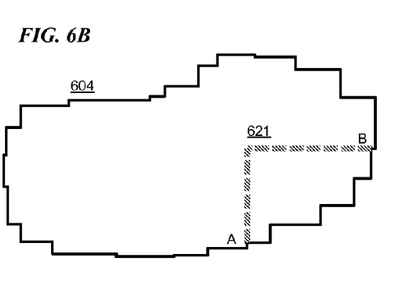

With reference to FIGS. 6A-6F, these figures depict several diagrams of example alternative fracture paths between two points via one or more additional points in accordance with an illustrative embodiment. Only as an example to illustrate an operation of an embodiment, a mask is depicted to include continuous shape 604, which is an enlarged portion of a high resolution shape, in each of FIGS. 6A-6F. FIGS. 6A and 6B depicts simple Manhattan jogs 620 and 621, which are analogous to the path options AIB and AHB in FIG. 5 respectively.

Figure 6C:
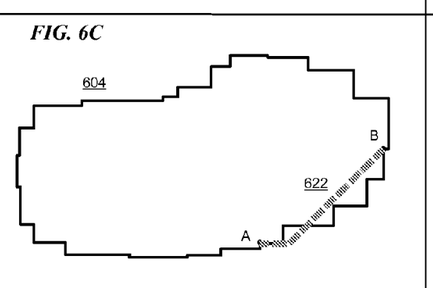
Figure 6D:
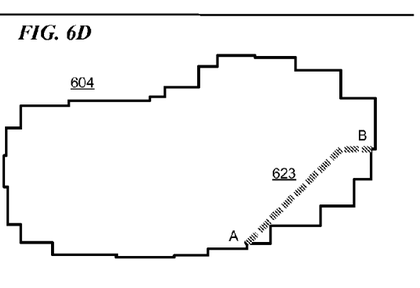

An embodiment may further allow fracture path options, such as fracture paths 622 in FIG. 6C and fracture path 623 in FIG. 6D, which have edges at orientations other than 0 and 90 degrees. In practice, mask fabrication and biasing technology may only support orientations of 0 or 90 degrees. Sometimes 45 and 135 degrees are simulated by a series of significantly smaller edges arranged in steps to give the impression of 45 or 135 degrees. In present cases 0 and 90 degree orientations are preferred. Even when 45 degree and 135 degree edges are supported through above simulated slants, it may be desirable to avoid a large increase in the number of new paths considered. In that case, an embodiment may be configured to limit consideration of jogs with 45 or 135 degree edges to cases where the cost metric on the Manhattan paths, such as Manhattan paths 620 and 621 in FIGS. 6A and 6B, is found to exceed a threshold. An embodiment may also be configured to limit considerations of jogs with other than 0 and 90 degrees angles when the cost metric along jogs, such as jogs 622 and 623 in FIGS. 6C and 6D, is found to be smaller than another threshold.

Figure 6E:
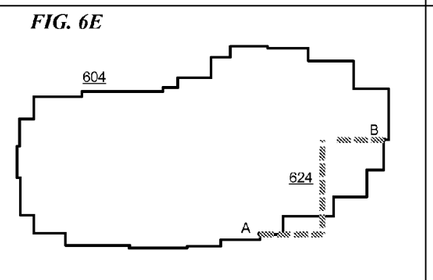
Figure 6F:
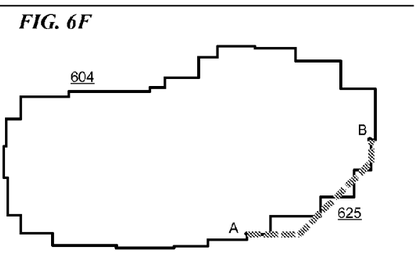

When points A and B exceed a third separation which may typically be larger than the first or second separations, an embodiment may be configured to consider new path options between points A and B that contain more than two edge segments, as illustrated by paths 624 and 625 in FIGS. 6E and 6F. To avoid consideration of large numbers of path alternatives, an embodiment may further choose location of the additional edge segments based on predetermined parameters, for example, to minimize the error metric obtained by interpolating between the error metrics found when the connector edges are placed at the coordinates of existing corners of the initial densely fragmented shape 604. An embodiment may also limit consideration of such new path alternatives to cases where the error metric is found to be smaller than a threshold.

Figure 7A:
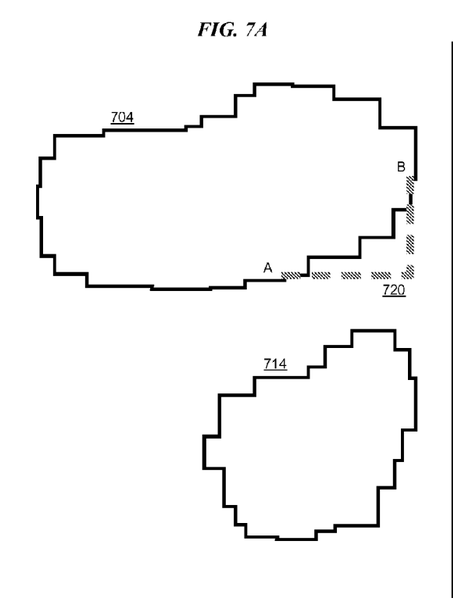
FIGS. 7A-7B depict several diagrams of example alternative fracture paths between two points via one or more additional points in accordance with an illustrative embodiment.
Figure 7B:
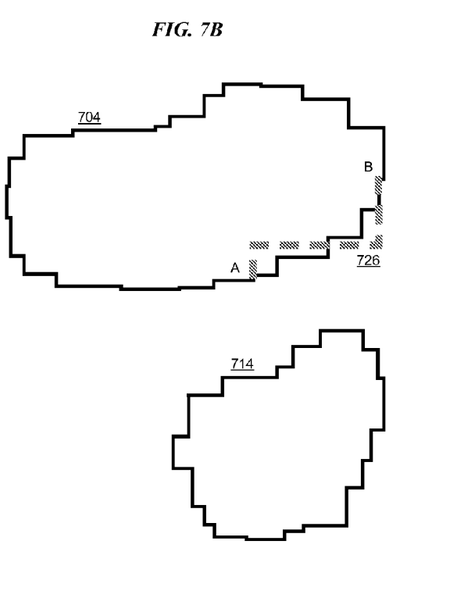

With reference to FIGS. 7A-7B, these figures depict several diagrams of example alternative fracture paths between two points via one or more additional points in accordance with an illustrative embodiment. Only as an example to illustrate an operation of an embodiment, a mask is depicted to include continuous shapes 704 and 714, which are an enlarged portions of a high resolution shape, in each of FIGS. 7A-7B.

An embodiment may also consider alternative path options that contain more than two edge segments as a method for ensuring dimensional feasibility during mask manufacture. For example, it may be that a fracture path option on one polygon, such as fracture path 720 on polygon 704, passes closer than a specified separation to some other edge on a mask feature, such as the upper edge of polygon 714. If a fracture path option that contains two edge segments is found to be separated from one or more mask edges by distances that are smaller than a distance that a given mask-making process can reliably fabricate, the fracture path may be omitted from consideration as an option.

However, if the endpoints of the path, such as points A and B, are sufficiently separated that fracture paths containing more than two edge segments may be considered, the edges of the path can then be shifted to achieve a manufacturable separation from other edges that are overly close, as illustrated by path 726. Additional segments may be added to the adjusted path in order to maintain connection with endpoints A and B, as seen in path 726.

It may sometimes be found that the imposition of manufacturability requirements on the fracturing results in a solution of significantly higher cost. An embodiment may remedy the solution cost by changing the topology of the solution. For example, when the imposition of manufacturability requirements causes the required size of a small polygon to increase significantly, for instance in the case where an area-matching metric is used, the small polygon may simply be deleted.

As another example, in cases where large shifts in at least one fracture edge must be imposed in order to move the edge to a manufacturable separation from another slightly separated edge within the same polygon, an embodiment may instead split the polygon in two by deleting the narrow interior connecting area that separates the two edges. The pair of polygons may still be regarded as being joined by a pair of oppositely directed edges occupying the same physical location in space, i.e. with their separation pinched down to zero.

Figure 8:
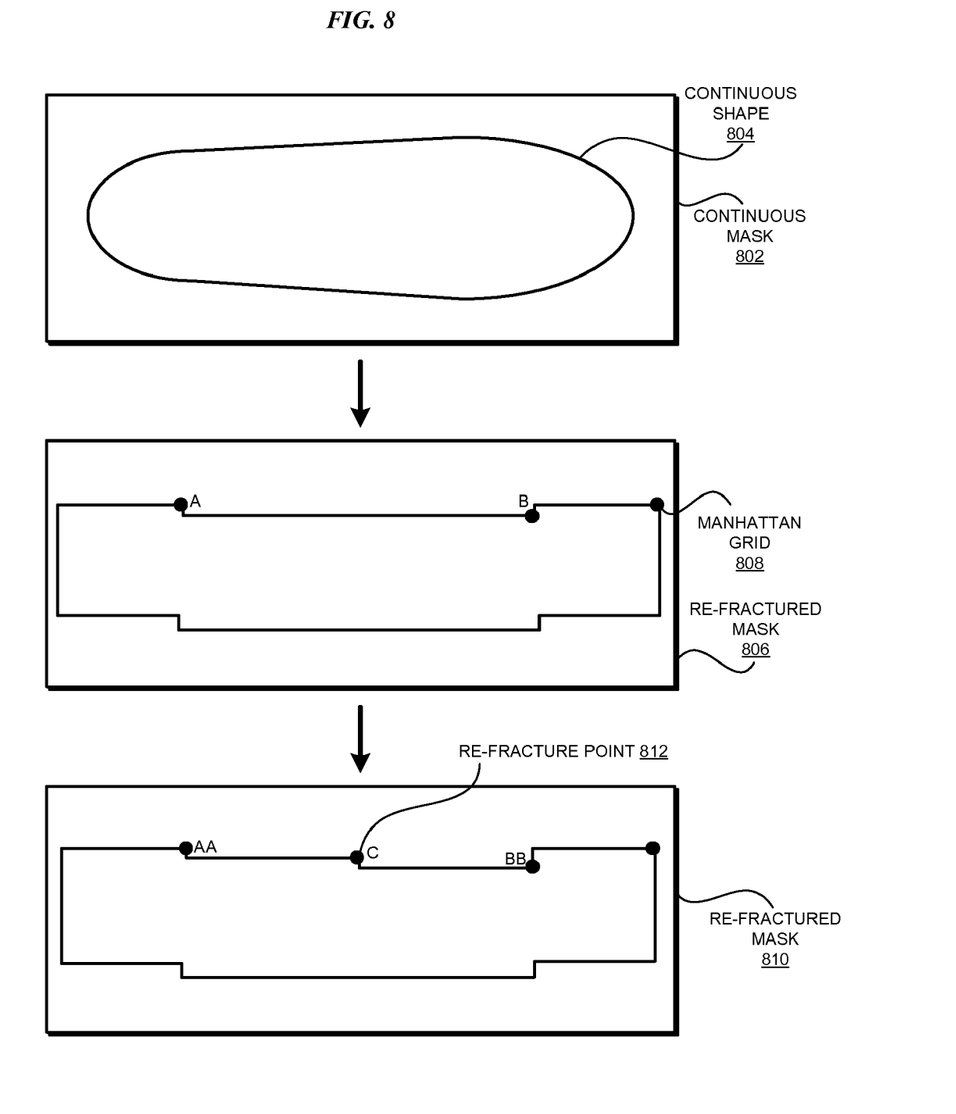
FIG. 8 depicts an example enhancement to a process of fracturing a continuous mask into a Manhattan grid in accordance with an illustrative embodiment.

With reference to FIG. 8, this figure depicts an example enhancement to a process of fracturing a continuous mask into a Manhattan grid in accordance with an illustrative embodiment. Continuous mask 802 and shape 804 may be similar to mask 502 and shape 504 respectively in FIG. 5. Fracturing shape 804 according to the process of an embodiment, such as using the embodiment of FIG. 5, results in fractured mask 806 having Manhattan grid 808. As an example to illustrate an operation of an embodiment, a particular feature in grid 808 may be bound by points A and B (feature AB).

For some reason, it may be desirable to further fracture, or re-fracture, feature AB. For example, a performance parameter of feature AB may have to be improved. As another example, a spacing between feature AB and another feature on mask 806 (not shown) may have to be increased. These example reasons for re-fracturing are not intended to be limiting on the invention. Many additional or different reasons for re-fracturing will be conceivable from this disclosure to those of ordinary skill in the art and the same are contemplated within the scope of the invention.

Having identified a feature to be re-fractured, such as feature AB for example, an algorithm according to an embodiment may return to the section of the curve of shape 804 on mask 802 that corresponds to that feature. The algorithm may then re-fracture that section of the curve, such by using smaller or different values for threshold d and the cost threshold.

The algorithm may re-fracture that section resulting in re-fractured mask 810 having Manhattan grid 812. Grid 812 includes point AA that corresponds to point A of grid 808 and point BB that corresponds to point B of grid 808. Re-fracturing point C has been introduced between points AA and BB effectively fracturing the feature AB into features AA-C and C-BB.

A feature may be re-fractured into any number of re-fractured features (sub-features) in this manner within the scope of the invention. Any number of features may be re-fractured in this manner within the scope of the invention. Some features may be re-fractured whereas other features may not be re-fractured in a particular implementation. The re-fracturing may be accomplished by changing the d threshold, the cost threshold, or both. The re-fracturing may also be accomplished by changing other rules or logic in the algorithm within the scope of the invention.

More generally, the simplified polygon fracturings produced as outputs by any of the above-described embodiments of the invention may be used as inputs in one or more subsequent re-applications of an embodiment, typically with different parameters, or using a different embodiment. For example, if after a first stage of fracturing the total shot count from all polygons is found to still exceed a target value, an embodiment may be rerun with larger minimum separations required along the path segments.

Figure 9:
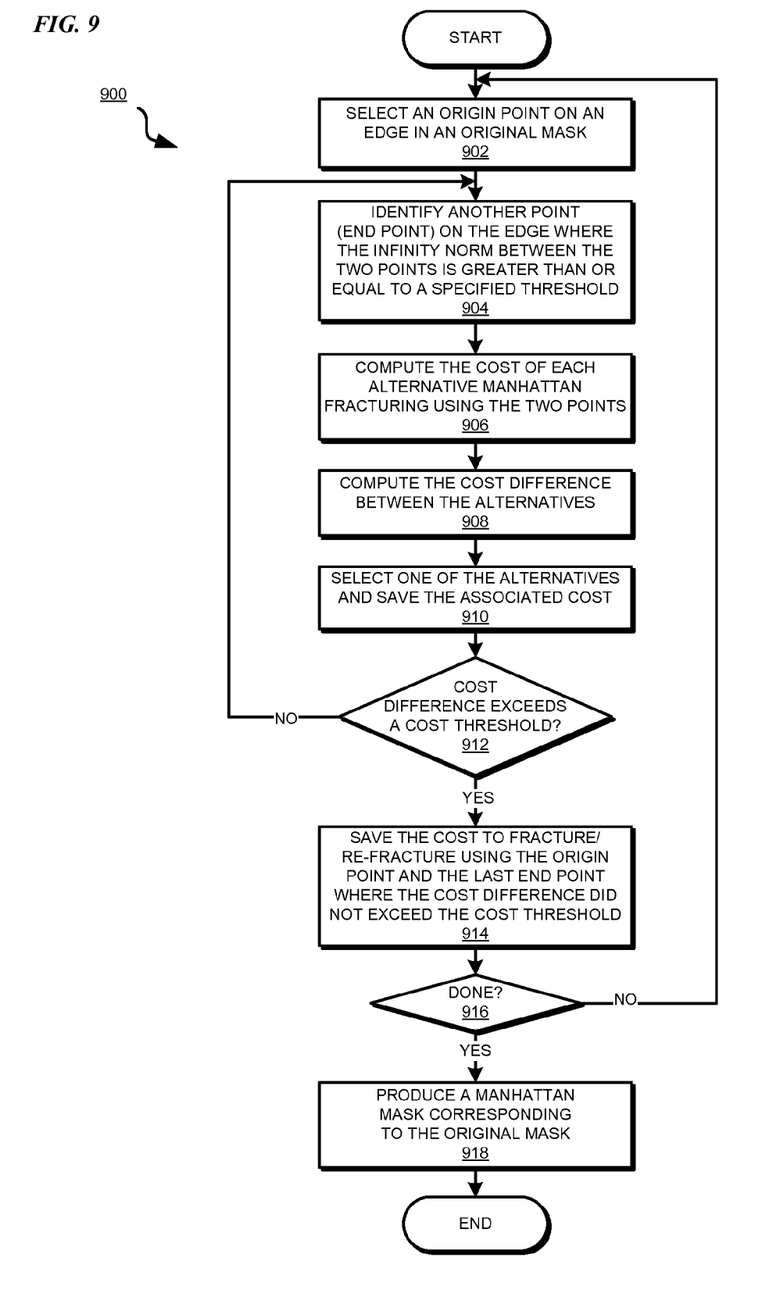
FIG. 9, this figure depicts a flowchart of a process of fracturing a continuous mask in accordance with an illustrative embodiment.

With reference to FIG. 9, this figure depicts a flowchart of a process of fracturing a continuous mask in accordance with an illustrative embodiment. Process 900 may be implemented in a software application, such as one capable of executing on data processing system 200 in FIG. 2. Process 900 may be executed in parallel on multiple portions of a mask, for example using more than one processing unit in data processing system 200. In one embodiment, process 900 may operate in conjunction with one or more processes of a chip design application. In another embodiment, process 900 may operate in conjunction with one or more OPC, inverse lithography, or SMO processes.

Process 900 begins by selecting an origin point on an edge in an original mask (step 902). An edge may be any curve or line in an original mask. An original mask may be a continuous mask or a high resolution mask, such as mask 102 in FIG. 1, mask 502 in FIG. 5, or mask 604 in FIG. 6A-6F.

Process 900 identifies another point, an end point, on the edge where the infinity norm between the two points is greater than or equal to a specified threshold (step 904). For example, the origin point may be point A and an end point may be point B in FIG. 5.

Process 900 computes the cost of each alternative Manhattan fracturing using the two points (step 906). For example, as depicted in FIG. 5, one cost of fracturing the edge AB in FIG. 5 may be the area of rectangle AHBI on one side of the edge AB (area AHB), and another alternative cost may be the area of rectangle AHBI on the opposite side of the edge AB (area AIB).

Process 900 computes the cost difference between the alternative costs (step 908). Process 900 selects one of the alternatives and saves the associated cost (step 910). For example, process 900 may select the smaller of two alternative costs from step 908 and save that smaller cost in step 910.

Process 900 determines whether the cost difference between the alternative costs of step 908 exceeds a cost threshold (step 912). If the cost difference does not exceed the cost threshold ("No" path of step 912), process 900 returns to step 904. If the cost difference exceeds the cost threshold ("Yes" path of step 912), process 900 saves the cost to fracture or re-fracture the edge using the origin point and the last end point where the cost difference did not exceed the cost threshold (step 914).

Process 900 determines whether the entire curve of the original mask has been traversed (step 916). If the entire curve has not been traversed ("No" path of step 916), process 900 returns to step 902. If the entre curve has been traversed ("Yes" path of step 916), process 900 produces a Manhattan mask corresponding to the original mask (step 918). Process 900 ends thereafter. As an example, process 900 may compute the least total cost of fracturing the original mask using the saved costs from step 914 for the various origin point-end point pairs. Process 900 may also be used in this manner to re-fracture an already fractured original mask.

The components in the block diagrams, the equations, and the steps in the flowcharts described above are described only as examples. The components, the equations, and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Thus, a computer implemented method, apparatus, and computer program product are provided in the illustrative embodiments for fracturing a continuous mask for use in photolithography based IC manufacturing. By using one or more illustrative embodiments of the invention, a continuous mask or a high resolution mask with poor manufacturability can be fractured into a Manhattan grid. The resulting Manhattan grid or Manhattan mask has improved manufacturability as compared to the corresponding continuous or high resolution mask. The improved manufacturability of the Manhattan grid produced using an embodiment is achieved at least partially by the size of the shots in the Manhattan grid. The size of shots in the Manhattan grid produced using an embodiment may be equal to a size corresponding to a given manufacturing resolution, or larger.

An embodiment may use any suitable algorithm for performing the computations described in this disclosure. An embodiment may also use a combination of two or more different algorithms to perform the same computation. The values, such as the locations of the origin points and end points, and the selected cost values may be saved in any suitable data structure in any suitable data storage device within the scope of the invention.

The invention can take the form of an entirely software embodiment, or an embodiment containing both hardware and software elements. In a preferred embodiment, the invention is implemented in software or program code, which includes but is not limited to firmware, resident software, and microcode.

Furthermore, the invention can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer implemented method for fracturing a continuous mask, comprising:
    selecting from a set of points a first origin point on an edge in the continuous mask, the continuous mask being a mask usable in manufacturing an integrated circuit (IC) by photolithography;
    identifying from the set of points a first end point on the edge such that a separation metric between the first origin point and the first end point is at least equal to a threshold value;
    determining a plurality of alternatives for fracturing using the first origin point and the first end point;
    computing a cost associated with each of the plurality of alternatives;
    selecting, by a processor, one of the plurality of alternatives having an associated cost as a preferred fracturing between the first origin point and the first end point;
    forming a plurality of pairs of origin points and end points from the set of points, each pair having a cost of a preferred fracturing between the pair, the first origin point and the first end point forming a first pair in the plurality of pairs of origin points and end points;
    fracturing the continuous mask using a subset of the plurality of pairs, the fracturing producing a fractured mask to manufacture the IC; and
    wherein the selecting one of the alternatives further comprises:
    determining a difference between the costs of two alternatives in the plurality;
    determining whether the difference exceeds a cost threshold; and
    selecting, responsive to the difference not exceeding the cost threshold, the alternative having smaller cost from the two alternatives.

2. The computer implemented method of claim 1, further comprising:
    selecting the subset of the pairs such that the pairs in the subset form a least total cost fracturing solution for the continuous mask.

3. The computer implemented method of claim 1, wherein the fractured mask includes a Manhattan grid, the Manhattan grid having a resolution at least equal to a manufacturing resolution.

4. The computer implemented method of claim 1, wherein the computing the cost further comprises:
    computing a first cost as an area of the rectangle on a first side of the edge between the first origin point and the first end point; and
    computing a second cost as an area of the rectangle on a second side of the edge between the first origin point and the first end point.

5. The computer implemented method of claim 1, wherein the fracturing is a Manhattan fracturing by forming a rectangle having the first origin point and the first end point at opposite ends of a diagonal of the rectangle.

6. The computer implemented method of claim 1, further comprising:
    selecting from the set of points a second end point on the edge such that the infinity norm between the first origin point and the second end point is at least equal to the threshold value;
    determining a second plurality of alternatives for fracturing using the first origin point and the second end point;
    computing a cost associated with each of the second plurality of alternatives; and
    selecting one of the second plurality of alternatives having an associated cost as a second preferred fracturing between the first origin point and the second end point, the first original point and the second end point forming a second pair in the plurality of pairs of origin points and end points.

7. The computer implemented method of claim 1, further comprising:
    selecting from the set of points a second origin point on the edge such that the infinity norm between the second origin point and the first end point is at least equal to the threshold value;
    determining a new plurality of alternatives for fracturing using the second origin point and the first end point;
    computing a cost associated with each of the new plurality of alternatives; and
    selecting one of the new plurality of alternatives having an associated cost as a new preferred fracturing between the second origin point and the first end point, the second original point and the first end point forming a new pair in the plurality of pairs of origin points and end points.

8. The computer implemented method of claim 1 wherein the continuous mask has a resolution higher than a manufacturing resolution.

9. The computer implemented method of claim 1, wherein the continuous mask is a high resolution mask.

10. The method of claim 1, wherein a globally optimal path approximation function is used for selecting the subset of the plurality of pairs for the fracturing.

11. The computer implemented method of claim 1, wherein the cost associated with an alternative between the first origin point and the first end point is represented as an interference perturbation metric, wherein the interference perturbation metric depends on a convolution of a function over a difference of two alternative areas covering the first origin point and the first end point, and wherein a calculation of a Manhattan grid approximation occurs interleaved with calculations for computing the cost associated with each of the plurality of alternatives.

12. The computer implemented method of claim 11, wherein the function is a dominant SOCS kernel wherein the convolution is evaluated at more than one sample point relative to the first origin point and the first end point, and wherein a sample point at which the convolution is evaluated is proximate to the two points by being within a distance from the first origin point and the first end point such that the distance is equal to a resolution of a lithographic lens.

13. The computer implemented method of claim 1, wherein a first pair and a second pair in the plurality of pairs are selected using different sets of values for a set of parameters associated with the plurality of pairs.

14. The computer implemented method of claim 1, wherein an alternative for fracturing connects the first origin point and the first end point via an intermediate point when the distance between the first origin point and the first end point exceeds a specified separation.

15. The computer implemented method of claim 1, wherein an alternative includes a plurality of edges, and wherein two adjacent edges are oriented at an angle other than zero degrees and ninety degrees with respect to one another.

16. The computer implemented method of claim 15, wherein the alternative including the two edges oriented at an angle other than zero degrees and ninety degrees with respect to one another is considered as an alternative fracturing path when a cost of another alternative with edges oriented at only zero degrees and ninety degrees angles with respect to one another exceeds a threshold.

17. The computer implemented method of claim 15, wherein the plurality of edges are configured such that the path is separated from another edge on the continuous mask by a manufacturable distance.

18. A computer usable program product comprising a computer usable non-transitory storage medium including computer usable code for fracturing a continuous mask, the computer usable code comprising:
   computer usable code for selecting from a set of points a first origin point on an edge in the continuous mask, the continuous mask being a mask usable in manufacturing an integrated circuit (IC) by photolithography;
   computer usable code for identifying from the set of points a first end point on the edge such that a separation metric between the first origin point and the first end point is at least equal to a threshold value;
   computer usable code for determining a plurality of alternatives for fracturing using the first origin point and the first end point;
   computer usable code for computing a cost associated with each of the plurality of alternatives;
   computer usable code for selecting one of the plurality of alternatives having an associated cost as a preferred fracturing between the first origin point and the first end point;
   computer usable code for forming a plurality of pairs of origin points and end points from the set of points, each pair having a cost of a preferred fracturing between the pair, the first origin point and the first end point forming a first pair in the plurality of pairs of origin points and end points;
   computer usable code for fracturing the continuous mask using a subset of the plurality of pairs, the fracturing producing a fractured mask to manufacture the IC; and
   wherein the computer usable code for selecting one of the alternatives further comprises:
   computer usable code for determining a difference between the costs of two alternatives in the plurality;
   computer usable code for determining whether the difference exceeds a cost threshold; and
   computer usable code for selecting, responsive to the difference not exceeding the cost threshold, the alternative having smaller cost from the two alternatives.

19. A data processing system for fracturing a continuous mask, the data processing system comprising:
   a storage device including a storage medium, wherein the storage device stores computer usable program code; and
   a processor, wherein the processor executes the computer usable program code, and wherein the computer usable program code comprises:
   computer usable code for selecting from a set of points a first origin point on an edge in the continuous mask, the continuous mask being a mask usable in manufacturing an integrated circuit (IC) by photolithography;
   computer usable code for identifying from the set of points a first end point on the edge such that a separation metric between the first origin point and the first end point is at least equal to a threshold value;
   computer usable code for determining a plurality of alternatives for fracturing using the first origin point and the first end point;
   computer usable code for computing a cost associated with each of the plurality of alternatives;
   computer usable code for selecting one of the plurality of alternatives having an associated cost as a preferred fracturing between the first origin point and the first end point;
   computer usable code for forming a plurality of pairs of origin points and end points from the set of points, each pair having a cost of a preferred fracturing between the pair, the first origin point and the first end point forming a first pair in the plurality of pairs of origin points and end points;
   computer usable code for fracturing the continuous mask using a subset of the plurality of pairs, the fracturing producing a fractured mask to manufacture the IC; and
   wherein the computer usable code for selecting one of the alternatives further comprises:
   computer usable code for determining a difference between the costs of two alternatives in the plurality;
   computer usable code for determining whether the difference exceeds a cost threshold; and
   computer usable code for selecting, responsive to the difference not exceeding the cost threshold, the alternative having smaller cost from the two alternatives.

* * * * *